United States Patent [19]

Schmitkons et al.

[11] Patent Number: 4,569,720

[45] Date of Patent: Feb. 11, 1986

[54] COPPER ETCHING SYSTEM

[75] Inventors: Thomas A. Schmitkons, Camillus; George J. Samuels, Syracuse; Joseph M. Ilardi, Dewitt, all of N.Y.

[73] Assignee: Allied Corporation, Morris Township, Morris County, N.J.

[21] Appl. No.: 607,553

[22] Filed: May 7, 1984

[51] Int. Cl.[4] .......................... C23F 1/02; B44C 1/22; C03C 15/00; C03C 25/06
[52] U.S. Cl. ........................... 156/646; 29/852; 51/281 R; 134/7; 156/638; 156/645; 156/659.1; 156/902; 204/15; 204/38.4; 427/97; 430/313; 430/318
[58] Field of Search ............... 29/846, 852; 51/281 R; 156/635, 638, 645, 646, 659.1, 901, 902; 427/96, 97, 98; 204/15, 24, 32 R, 38 B; 430/313, 318; 174/68.5; 134/7

[56] References Cited

U.S. PATENT DOCUMENTS 4,451,327  5/1984  Nelson .............................. 156/646

Primary Examiner—William A. Powell
Attorney, Agent, or Firm—R. C. Stewart, II; J. P. Friedenson

[57] ABSTRACT

The invention relates to a novel process of etching a metal clad substrate which comprises contacting said substrate with one or more reactive gases, as for example ozone, to form one or more reaction products on the surface of the said metal which are more friable than said metal, and striking said reaction products with a plurality of abrasive particles.

35 Claims, 11 Drawing Figures

COPPER ETCHING SYSTEM

BACKGROUND OF THE INVENTION

1. Field of the Invention

This invention relates to a novel process for etching metal. More particularly, this invention relates to a novel copper etching process which is particularly useful in the manufacture of printed circuit boards.

2. Brief Description of the Prior Art

Printed circuit boards are widely used by the modern electronics industry as interconnecting devices. Prior art manufacturing processes are characterized as subtractive, additive or as semi-additive processes. Of these processes, the subtractive and the semi-additive processes require removal of unprotected copper from the insulating board substrate. An example of a subtractive process for a single sided board is one in which a copper foil, usually relatively thick, is applied to an insulating base substrate, desired mounting holes are formed therein, and an etch resist material, usually a tin/lead solder, is applied or formed over the copper layer in the positive image of the desired circuit configuration. The board is immersed in a copper etchant that removes the copper from the areas unprotected by the resist, leaving the desired circuit configuration. Because the copper layer is relatively thick, a strong etchant and considerable time is required to accomplish the fabrication. Where plated through holes are desired, the foregoing subtractive process can be modified in an "additive" way by forming holes, and then electrolessly plating over the copper covered laminate to coat the thick copper layer and the hole walls. A plating resist is then applied over the electroless copper surface in the negative image of the desired patterns and copper electrolytically applied to the desired thickness. Then a dissimilar metal-resist is applied over the portions of the copper surface to be retained typically by electrolytic plating of a nickel metal or a solder metal (tin/lead) to cover the plated hole walls as well, and in the subsequent step of etching, generally only the undesired copper is removed.

In the semi-additive process, through-holes are formed in an insulating substrate, followed by activation of the substrate and the through-holes with a noble metal ion activating solution. This is followed by electroless deposition of copper on the top of the substrate and on the walls of the formed holes through use of plating solution. Thereafter, a first resist, such as a photoresist or screen printable resist, is applied to the formed board in the negative image of the desired circuit pattern leaving exposed those regions of the electroless copper corresponding to the desired circuit pattern. A copper layer is then electroplated on top of the exposed electroless copper portions, including the hole walls. The first resist is removed and the structure is immersed for a time in a copper etchant which removes the uncovered electroless copper. Alternatively, the electroplated surfaces of the substrate can be electroplated with a second etch resist such as a silver, tin, lead or gold to cover the surfaces of the electroplated copper prior to removal of the first resist followed by removal of the first resist and etching of the copper. The copper underlying the second etch resist forms the desired circuit on the circuit board.

A problem encountered with solution etching used in conventional subtractive processes and to a lesser extent in conventional semi-additive processes is undercutting at the edges of the conductive paths. Etch factors of 2.0 are normal for solution etching, i.e., the etching process proceeds two times as fast in the vertical directions as it does in the lateral direction. Undercutting makes it difficult for the circuit board manufacturer to control conductor width and profile, and is thus one of the major factors limiting the resolution attainable in printed circuit boards. Solution etching also promotes galvanic corrosion, due to difference in potential between the etch resist, usually solder, and the copper, which further compounds the resultant conductor profile. Control of conductor profile is a severe problem not only in production of high resolution printed circuit boards, but also in production of circuit boards for controlled impedance and microwave applications.

About a decade ago the integrated circuit industry faced a similar problem of undercutting during solution etching. This was overcome by the development of dry etching techniques such as plasma etching, ion milling, sputter etching, and reactive ion etching. These processes must be carried out in a vacuum chamber. Material is removed by formation of volatile products from reaction with selectively reactive gaseous species generated in-situ (plasma etching), by bombardment of the wafer surface with accelerated ions (ion milling and sputter etching), or by a combination of both (reactive ion etching). These techniques are unsuited for etching printed circuit boards for several reasons. First, very large and expensive vacuum systems would be required because of the large size of printed circuit boards. Second, the etch rates in these procedures are much too low for economical application of the procedures to the manufacture of printed circuit boards. Typical etch rates are two orders of magnitude lower than those common for printed circuit board etching. Third, copper which must be removed during etching of printed circuit boards does not form volatile products with the reactive species typically used for plasma etching. Therefore, copper is very difficult if not impossible to etch by this method.

SUMMARY OF THE INVENTION

This invention relates to a dry method for etching metal. The novel method of this invention comprises exposing the surface of the metal to be etched to an "effective amount" of one or more "reactive gas" forming one or more reaction products on the surface of said metal which are more "friable" than said metal; and striking said reaction products with abrasive particles in an amount and for a time sufficient to erode away all or part of said reaction products.

The method of this invention is particularly suited for use in the fabrication of printed circuit boards by the subtractive and semi-additive processes. A preferred method of using the improvement of this invention in the subtractive process comprises the steps of:

(a) covering the metal cladding with a predetermined pattern of protective material to form a desired exposed pattern on the surface of the said metal cladding;

(b) contacting the unprotected metal cladding with an effective amount of one or more reactive gases forming one or more reaction products on the surface of said metal which are more friable than said metal;

(c) striking said reaction products with a plurality of abrasive particles for time sufficient to erode away all or apart of said reaction products; and (d) removing the protective material.

A preferred method of using the improvement of this invention in the semi-additive process comprises the steps of:

(a) electrolessplating a metal plate onto at least one surface of a substrate composed of an insulating material;

(b) applying to a portion of said metal plating a protective material to provide the desired circuit pattern on said surfaces of the metal plating;

(c) electroplating the desired circuit pattern with a metal plating;

(d) removing said protective material from said metal plated substrate; and (e) differentially etching said metal from a portion of metal cladding previously covered by said protective material to provide a board having the desired metal circuit pattern on at least one surface thereof; wherein said improvement comprises differentially etching said metal from said board by contacting said metal with a reactive effective amount of one or more reactive gases forming one or more reaction products on the surface of said metal which are more friable than said metal; and striking said reaction products with a plurality of abrasive particles at a velocity and for a time sufficient to erode away all or a portion of said reaction products.

The nature of the dry etching process of this invention makes it possible to achieve etch factors much greater than those attainable with wet etching processes now in common use in printed circuit board manufacture. This is highly desirable since it allows greater control over the width and profile of conductors which is very important in high resolution, controlled impedance, and microwave circuitry. The high etch factor attainable with the dry etching process of this invention also makes it possible to use the simple and less costly panel plating process in place of the pattern plating process in many applications where the latter process is currently required to minimize undercutting.

The etching process of this invention also has the advantage of being a dry process. All wastes generated are dry, and therefore, much easier to handle and dispose of than the liquid waste from solution etching processes.

DETAILED DESCRIPTION OF THE INVENTION

Figure 1:
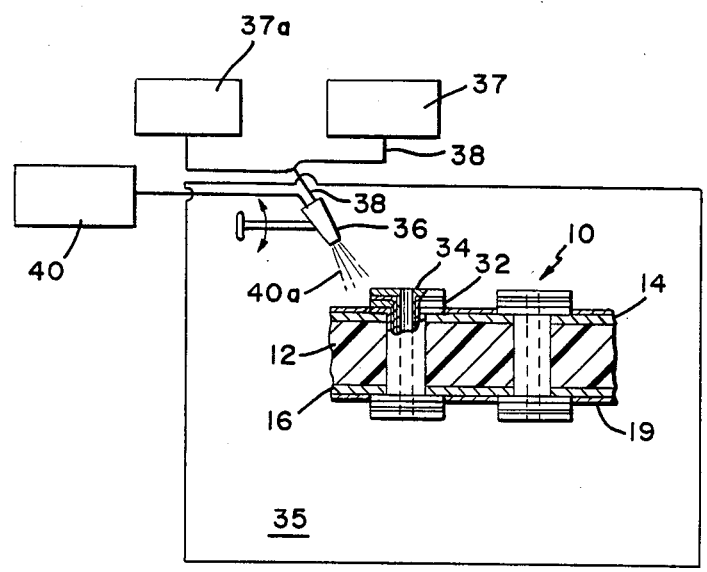
FIG. 1 is an apparatus useful for carrying out the process of this invention depicting a printed circuit board being etched.

In the first step of the process of this invention, all or a portion of the metal surface is exposed to a "reactive effective amount" of a "reactive gas". As used herein, "a reactive effective amount" is an amount of the reactive gas which is sufficient to react with the metal surface to any extent. While not intended to limit the scope of the invention, it is believed that the reactive gas reacts with the metal surface to form metal compounds on the surface. Normally the greater the amount of reactive gases, the greater the amount of metal compounds formed on the metal surface. Conversely, the less the amount of reactive gases, the less the amount of metal compounds formed. The amount of reactive gases used in any particular situation, will depend on a number of factors, as for example, the exposing temperature, the susceptibility of the particular metal to attack by or reaction with the reactive gases. In general when employing preferred operational parameters, good results are achieved when the amount of reactive gases is at least about 0.01 weight percent based on the total weight of gases in the exposing atmosphere. In the preferred embodiments of this invention, the amount of reactive gases is at least about 0.5 weight percent based the total weight of the gases in the exposing atmosphere, and in the particularly preferred embodiments of this invention the amount of reactive gases is at least about 1 weight percent of the same bases. Amongst these particularly preferred embodiments, most preferred are those embodiments in which the weight percent of exposing gases in the atmosphere is at least about 3 weight percent based on the total weight of gases in the atmosphere.

The upper weight percent of reactive gases is not critical, and best results would be achieved if an atmosphere composed of 100% reactive gases is employed. However, due to economical considerations and/or the inherent difficulty of generating atmospheres composed predominately of reactive gases, atmospheres containing less than about 80 or 90 weight percent of the reactive gases are normally used. The remainder of the exposing atmosphere will comprise one or more inert carrier gases. Illustrative of such gases are air, nitrogen, oxygen, carbon dioxide, noble gases, mixtures of the foregoing gases and other gases which meet the requirement of non-reactivity with the reactive gases.

As used herein, "reactive gas" is any gas or combination of gases which will react with the metal surface. The type of reactive gas employed in any particular situation is not critical provided that it reacts with the metal surface. Illustrative of reactive gases which can be employed in the process of this invention are sulfur trioxide, ozone, hydrogen chloride, fluorine, chlorine, bromine, silicon tetrachloride, and the like. Preferred for use in the process of this invention are sulfur trioxide, ozone and hydrogen chloride, usually admixed with air, and particularly preferred for use in the practice of this invention are mixtures of ozone and hydrogen chloride, and mixtures of ozone and hydrogen chloride with other inert gases such as air, nitrogen, argon, neon and the like.

In the preferred embodiments of this invention, the relative humidity of the reactive gas is greater than about 40%, and in the particularly preferred embodiments is greater than about 55%. Amongst the particularly preferred embodiments, most preferred are those embodiments in which the relative humidity is greater than about 70%.

Process temperatures are not critical and can be varied widely as desired. As is indicated above, there is a relationship between exposure times, exposure temperatures and the quantity and type of reactive gases in the exposing atmosphere. Thus, the higher the exposure temperature, the shorter the exposure times and the smaller the quantity of reactive gases required to provide acceptable results, and; conversely when lower temperatures are employed, longer exposure times and larger quantities of reactive gases may be required. When operating under preferred conditions, the process can be conveniently carried out at a temperature as low as about −30° C. and lower, and up to a temperature of about 150° C. and higher, depending on the particular metal being etched. The process is usually carried out at a temperature of between about 15° C. and about 90° C., and preferably from about 15° C. to about 60° C., mainly for convenience of operation.

Process pressures are also not critical and can be varied widely. The process can be carried out at sub-atmospheric, atmospheric or super-atmospheric pressure. However, the process is usually conducted at atmospheric or autogenous pressure for convenience.

In the first step of the process of this invention, the metal is exposed to the reactive gases for a time sufficient to react with the metal surfaces to form one or more reaction products on the surface of the exposed metal which are more friable than the metal. As used herein, "friable" is used in the conventional sense and is an indication of the brittleness or ease with which the material can be broken or pulverized by striking with abrasive particles in step two of the process. The greater the friability of the reaction products, the easier they are broken or pulverized when struck by the abrasive particle; and conversely, the lesser the friability of the products the harder they are to break or pulverize. As was noted hereinabove, the duration of exposure will depend on a number of factors including exposure temperatures and the quantity of reactive gases in the exposing atmosphere. Exposure times are not critical and can be varied over a wide range as desired provided that the aforementioned result is obtained. For example, exposure times can vary from about a few seconds up to about 24 hours or more. In most instances, however, exposure times will vary from 1 to 5 seconds up to about 1 to 2 hours under the preferred process conditions, and these exposure times represent the preferred range of exposure times. In the most preferred embodiments of this invention, exposure time will vary from about 20 seconds to about 5 minutes.

It should be appreciated that the preferred exposure time, exposing temperature and concentration of reactive gases in the exposing atmosphere for any particular application will depend on the type of metal being subjected to the process of this invention and the particular reactive gases being used. Thus, the preferred set of process parameters for any particular application will preferably be selected in accordance with the chemical structure and reactivity of the metal and the reactive gases in such a manner that optimum reaction at the surface of the metal is provided.

The metal employed is not critical and can be varied widely provided that it is reactive with at least one reactive gas. Illustrative of such useful metals are copper, nickel, iron, chromium, tin, lead, aluminum and the like and metal alloys or for example various copper and nickel alloys. In the preferred embodiments of this invention in which the process is used in the manufacture of printed circuit boards, copper is the metal of choice.

In the second essential step of the process of this invention, the metal which has been or is being exposed to the reactive gases is etched away by striking said metal with a plurality of abrasive particles having a dimensional size and velocity, and concentration such that the products of the reaction of the exposed copper or other metal with the reactive gases are eroded away without significantly abrading the unexposed copper or other metal or protective coating. In the preferred embodiments of this invention, the exposing step and etching step are carried out concurrently. Thus, the reaction products are continually removed as they are formed exposing more of the metal to the reactive gases. The reaction/abrasion continuous process is continued until the desired amount of metal has been etched away. This greatly increases the rate of removal of the metal.

The abrasive material is not critical and can be varied widely. Two factors which influence the use of a material in any particular situation are its hardness or scratch resistance and toughness or fracture resistance as compared to the hardness and toughness of the metal reaction products being removed, and the hardness and toughness of the protective material and the substrate to which the metal is bonded. Ideally, the abrasive material should be harder and tougher than the reaction product. Generally, the harder and tougher the abrasive material as compared to the reaction products, the more rapid the removal of the reaction products, and conversely, the less hard and less tough the abrasive material as compared to the reaction products, the less rapid the removal of the reaction products. Illustrative of abrasive materials which can be used in the practice of this invention are glass, silica, alumina, sand, carborundum, garnet, almandine, andalusite, andradite, beryl, benitoite, bixbyite, boracite, braunite, cassiterite, chondradite, chrysoberyl, cordierite, corundum, danburite, cristobalite, diaspore, euclasite, forsterite, grossularie, hambergite, hydrogrossularite, moissanite, olivine, phenakite, pyrope, guartz, sapphine, sillimante, sperrylite, spessartite, spinel, spodumene, staurolite, tridymite, zircon, and the like.

Particle size while not critical to the overall effectiveness of the process is critical to the fineness of the etch. Generally, when used in the substractive process for the manufacture of printed circuit boards, the abrasive particles will have a dimensional size equal to or less than about 100 $\mu M$. In the preferred embodiments of the invention, the particle size is equal to or less than about 50 $\mu M$ and in the particularly preferred embodiments particle size is equal to or less than about 25 $\mu M$. Amongst these particularly preferred embodiments, more preferred are those embodiments in which the particle size is equal to or less than about 10 $\mu M$.

The particles are preferably propelled by a dry gas such as air, oxygen, nitrogen or one or more of the reactive gases. In the preferred embodiments of the invention, the particles are propelled by one or more of the reactive gases, or mixtures thereof with an inert gas. The exact amount of gas pressure used to propel the particles can vary widely and will depend on a number of factors, including the relative nozzle size and equipment utilized, and the like. Generally, when employing the preferred process condition, the gas pressure will vary from about 5 to about 120 psi, and under particularly preferred condition will vary from about 10 to about 60 psi. In the most preferred embodiments of this invention the gas pressure will vary from about 15 to about 40 psi.

The etching is continued for a period of time sufficient to remove the copper or other metal from areas not protected by the etch resist or other protective material. Etching times can vary widely depending on a number of factors including the reactivity of the metal and reactive gas, particle hardness and toughness, particle size, particle velocity, concentration of particles in stream and the distance of the nozzle from the surface being etched.

The reaction of the reactive gas with the metal proceeds very rapidly initially but quickly slows to a negligible rate because of the formation of a layer of reaction products such as metal oxides, metal chlorides, metal sulfates, which prevents penetration of the reactive gas to the unreacted metal under the layer. The stream of particles functions to ablate this relatively brittle layer of reaction products and thus to allow the reaction to continue at a rate close to the very high initial rate. The resultant etching is anisotropic because of the directionality of the ablating particles. The reaction products are ablated from the plane perpendicular to the direction of the particle stream (the plane of the circuit board) but the layer of reaction products on the walls of the forming groove is relatively undisturbed and serves to protect the walls from further attack by the reactive gas.

While the process of this invention can be used to etch any kind of metal, it is particularly useful in the manufacture of printed circuit boards by the subtractive process. The general technique of forming printed circuit boards by the subtractive process is very well known in the art. Examples of the subtractive process are described in detail in U.S. Pat. Nos. 3,673,680 and 4,135,988. This invention provides an improvement in the substractive process so that copper is removed with a reduced degree of undercutting of the conductors. In these preferred embodiments, prior to exposure to the reactive gas, the copper clad substrates (which are usually panels of fiber glass reinforced epoxy covered with copper) are first covered with a coating of a protective material to form a desired exposed pattern on the surface of the copper cladding. In the particularly preferred embodiments, this exposed pattern is formed by covering the surface of the copper cladding with a coating of a protective material, such as a photoresist material. The photoresist or other protective material can then be masked with a predetermined circuit design image. The masked material can then be exposed through the masking image to a source of energy to polymerize the exposed protective material. A portion of the protective material can then be removed exposing the bare copper to provide a circuit design pattern on the surface of the copper cladding which is either covered by the developed protective material or defined by the bare copper. Where the circuit is covered by the polymerized protective material, the bare copper can be exposed to the reactive gas and etched as described hereinbelow. Where the desired circuit is defined by the bare copper, additional copper may be electroplated over the exposed copper and an etch resist, usually a metallic material such as a tin/lead alloy which is resistant to the reactive gases and etching, is formed over the electroplated copper. The remaining developed or polymerized photoresist can then be removed, and the copper which was under this photoresist can be exposed to the reactive gases and etched away as described in more detail hereinbelow.

The following specific example is presented to more particularly describe the inventions.

EXAMPLE

Referring now to the drawings, FIGS. 2-11 illustrate the sequence of the process steps in accordance with a preferred embodiment of the improvement of the present invention when used in the subtractive process, beginning with the basic process material and ending with the finished product, which is a printed circuit board with plated through-holes.

Figure 2:
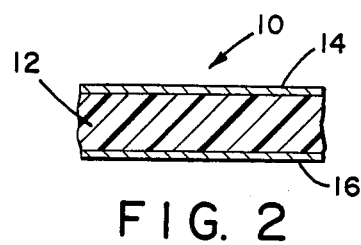
FIGS. 2 to 11 are a series of fragmentary sectional views corresponding to successive process steps in the preparation of a printed circuit board with plated through holes in accordance with the present invention.
Figure 7:
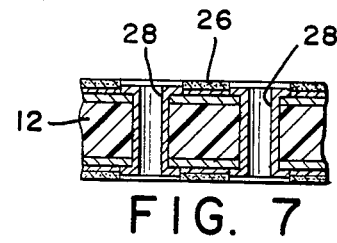

The basic starting material is shown in FIG. 2 and consists of a copper clad epoxy glass board 10. Board 10 consists of an epoxy glass substrate 12 which may be of a material known as "C" stage glass epoxy. The substrate 12 is laminated with an extremely thin copper clad or films 14 and 16 on opposite sides thereof. Copper film 14 and 16 have a thickness of about 0.0014 inch while the substrate has a thickness of approximately about 0.062 inch.

Figure 3:
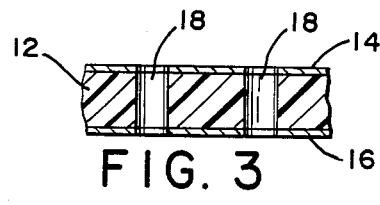

Holes or apertures 18 are formed through laminated board 10 at predetermined locations where plated through-holes are required. Holes 18 are illustrated in FIG. 3 and may be formed, for example, by drilling by a tape controlled drilling machine. Board 10 may be supported during the drilling process by an epoxy glass or aluminum back-up sheet and a paper phenolic entry material.

It is desirable, initially, to sensitize the exposed surfaces of the epoxy glass substrate 12 at the drilled holes 18. This may be effected by a suitable catalyst, such as palladium chloride.

Figure 4:
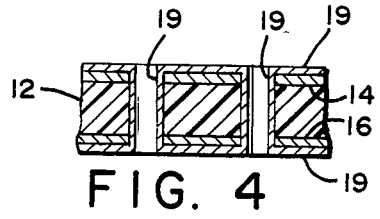

Subsequently, a thin film or layer of copper 19 is plated over the entire board by conventional plating means. This may, for example, be effected by electroless copper plating to provide a film approximately 0.0001 inch thick. Layer 19 also covers the surfaces of the holes 18, as shown in FIG. 4.

The desired circuit images on both sides of board 10 may be applied by any conventional means. Preferably, however, a dry film photoresist is applied, and subsequently exposed and developed. To this end board 10 is initially cleaned. This may be effected by a sander or by a brush having fiber bristles and pumice. Subsequently, board 10 may receive a tap water rinse and may be dried by filtered compressed air.

A dry film photoresist layer 20 and 22 is applied to opposite surfaces of board 10. The photoresist layer may, for example, consist of DuPont Ristom 218R. The photoresist layers may be applied by passing the resist and board through a laminator. This may be effected at a temperature between 220° F. and 255° F., depending upon the type of laminator utilized. The thickness of the photoresist layer is determined by the desired thickness of the plated circuit. Normally, the photoresist layer is somewhat thicker, i.e., 0.0003 inch, than the desired thickness of the plated circuit. By way of example, to achieve a plated circuit of approximately 1.5 mil thickness, the photoresist layer should have a thickness of 1.8 mil.

Figure 5:
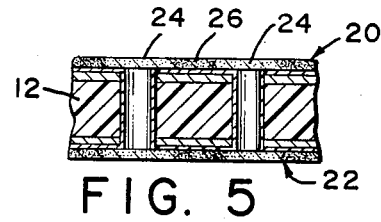

The thus-applied or laminated photoresist layers 20 and 22 are then photographically exposed through a suitable mask. Subsequently, photoresist layers 20 and 22 are developed. This will remove non-polymerized areas 24 which are susceptible to the developer. These areas 24 correspond to the areas of the circuits to be plated and to the surfaces of holes 18. Photoresist layers 20 and 22 then have polymerized areas 26 which are resistant to the developer and which cover all other areas of photoresist layers 20 and 22 as shown in FIG. 5. The DuPont Riston 218R photoresist may be exposed by a light source in a vacuum of 23 inches of mercury or more for a time of approximately one and one-quarter minutes. Following exposure, the vacuum is released and the resist is normalized at room temperature for at least 30 minutes. Then the photoresist may be developed in a suitable processor.

Figure 6:
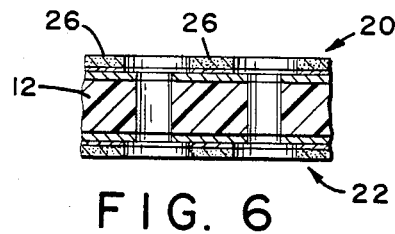

FIG. 6 illustrates board 10 after non-polymerized areas 24, which are susceptible to the developer, have been removed. This may, for example, be effected by immersion in a suitable developing solution which exposes holes or apertures 18 and the desired circuit images on both sides of the board.

Figure 8:
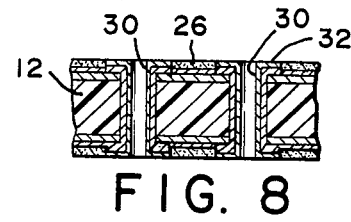

The next plating step is an electro-copper plating step. To this end, an acid copper process may be used for example, to achieve a minimum copper plating 30 (see FIG. 8) of 0.001 inch over the surfaces of the holes and a copper circuit 32 of approximately 0.0025 inch. The circuit plating 32 is contained within the boundary of the walls of polymerized photoresist 26 as shown in FIG. 8.

Figure 9:
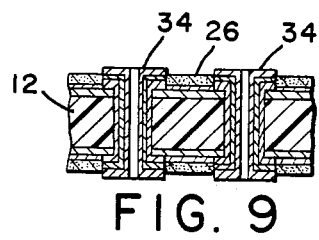

After the electro-copper plating step, the exposed copper layers 30 and 32 are then electro solder plated. This plating is continued until a minimum thickness of about 0.0003 inch of solder layer 34 is plated on the surfaces of copper layers 30 and 32 and holes 18. This is illustrated in FIG. 9.

Figure 10:
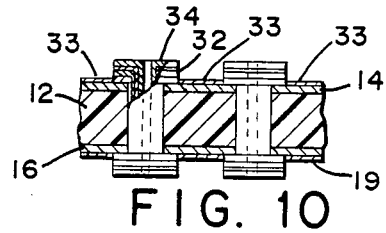

Following the electro plating step, polymerized photoresist 26 is removed. By way of example, it may be stripped with a suitable solvent as shown in FIG. 10, to expose bare copper layer 33. Thereafter all exposed copper layer 33 from the original film 14 and 16 is etched away by the improved etching procedure of this invention. This etching procedure can be more readily appreciated from a consideration of FIG. 1. Board 10 is exposed to a reactive gas in ozonalysis chamber 35 as depicted in FIG. 1. Chamber 35 consists of an enclosed space in which board 10 is placed. Chamber 35 also includes a nozzle 36 which is connected to a source of abrasive particles 40, preferably alumina or silica, and ozone generator 37.

Referring again to FIG. 1, an ozone/air mixture containing about 2% ozone is generated in ozone generator 37 and is combined with an inert gas or one or more other reactive gases such as hydrogen chloride from gas source 37(a). The combined gases are charged into chamber 35 via line 38. Board 10 with the pattern of solder covered copper layers 30 and 32 is then placed into chamber 35, and the exposed copper layer 33 is allowed to react with the ozone afterwhich the exposed surfaces of copper layer 33 are struck with a plurality of abrasive particles 40a having a dimensional size and velocity to erode away exposed copper layer 33 while at the same time not removing the solder covered copper layers 30 and 32. Preferably ozone exposure is continued during the period during which the exposed surfaces of copper layer 33 are struck with particles 40a. The solder layer 34 has been applied with sufficient thickness to maintain at least a sufficient amount of protective material to continually protect copper layers 30 and 32 that it covers while at the same time not inhibiting the sharply defined cutting or eroding away of the exposed copper layer 33.

As can be seen in the FIG. 1, the predetermined pattern or circuit image is cut into the surfaces of board 10 using a dry blasting technique with abrasive particles 40a which are preferably particles of silica or alumina having a dimensional size of approximately 10 $\mu M$ or less. Particles 40a are propelled by approximately 40 psi of gas pressure generated by the combined reactive and inert gases. The exact amount of gas pressure will of course be subject to the relative nozzle size and equipment utilized, and satisfactory results have been achieved with gas pressures in the range of 5 psi to 120 psi. The source of abrasive particles 40, ozone generator 37 and gas source 37a are connected to spray nozzle 36 which is mounted within chamber 35 to provide a spray pattern of abrasive particles 40a across the exposed copper layer 33 of board 10 coated with the protective solder layer 34. Either spray nozzle 36 can move with a translational motion relative to board 10, or board 10 can be moved, as for example on a carrier plate or belt (not shown) relative to spray nozzle 36. In either arrangement, the entire surface of board 10 will be sprayed with abrasive particles 40a.

Figure 11:
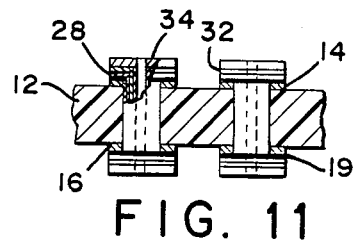

The etching is continued for a time sufficient to remove copper from areas not protected by solder layer 34, afterwhich board 10 is subjected to other conventional processing steps to produce the final printed circuit board which is ready for attachment of discrete devices thereon. The finished plated throughhole printed circuit board is illustrated in FIG. 11.

What is claimed is:

1. A method of etching metal which comprises:
   (a) exposing all or a portion of the surfaces of said metal to a reactive effective amount of one or more reactive gases forming one or more reaction products on the surface of said metal which are more friable than said metal; and
   (b) striking said reaction products on said metal surface with plurality of abrasive particles for a time sufficient to erode away all or a portion of said products from said surface.

2. A method of etching metal from a metal clad substrate which comprises:
   (a) exposing all or a portion of the surfaces of the metal cladding to a reactive effective amount of one or more reactive gases forming one or more reaction products on the surfaces of said metal which are more friable than said metal; and
   (b) striking said reaction products on said metal surfaces with a plurality of abrasive particles in an amount and for a time sufficient to erode away a pre-determined amount of said products from said surfaces.

3. A method according to claim 2 wherein said metal is copper.

4. A method of preparing a printed circuit board from a copper clad substrate which comprises:
   (a) covering the surface of said copper cladding with a pre-determined pattern of protective material to form a desired exposed pattern;
   (b) contacting the uncovered copper cladding with a reactive effective amount of one or more reactive gases forming one or more reaction products on the surface of said metal which are more friable than said metal; and
   (c) striking said reaction products with a plurality of abrasive particles at a velocity and for a time sufficient to erode all or a portion of said products from said surface.

5. A method according to claim 4 which further comprises removing the protective material.

6. A method according to claim 4 wherein said protective material is a polymerized photoresist adhered to the surface of said copper cladding which photoresist is resistant to said reactive gases and abrasion by said abrasive particles.

7. A method according to claim 4 wherein said protective material is a thixotropic material screen printed on the surface of said copper cladding which thixotropic material is resistant to said reactive gases and abrasive particles after curing.

8. A method according to claim 4 wherein said protective material is a metal etch resist adhered to the surface of said copper cladding which resist is resistant to said reactive gas and to said abrasive particles.

9. A method according to claim 4 wherein said unprotected copper cladding is contacted with said gases and struck with said abrasive particles concurrently.

10. A process according to claim 1 wherein said one or more reactive gases are selected from the group consisting of ozone, hydrogen chloride, sulfur trioxide, chlorine, bromine, flourine and silicon tetrachloride.

11. A process according to claim 10 wherein said one or more reactive gases are selected from the group consisting of ozone, hydrogen chloride, and sulfur trioxide.

12. A process according to claim 11 wherein said one or more reactive gases comprises a mixture of ozone and hydrogen chloride.

13. A process according to claim 1 wherein the amount of said one or more reactive gases in the exposing atmosphere is at least about 0.1 weight percent based on the total weight of gases in the atmosphere.

14. A process according to claim 13 wherein said amount is from about 0.5 to about 90 weight percent based on the total weight of gases in the atmosphere.

15. A process according to claim 14 wherein said amount is from about 0.5 to about 40 weight percent based on the total weight of gases in said exposing atmosphere.

16. A process according to claim 15 wherein said amount is from about 1 to about 5 weight percent based on the total weight of gases in the exposing atmosphere.

17. A process according to claim 1 wherein said particles are composed of materials which are non-hygroscopic materials.

18. A process according to claim 17 wherein said materials are selected from the group consisting of glass, alumina and silica.

19. A process according to claim 18 wherein said materials are selected from the group consisting of alumina and silica.

20. A process according to claim 1 wherein said abrasive particles have an average dimensional size equal to or less than about 100 $\mu M$.

21. A process according to claim 20 wherein said average dimensional size is equal to or less than about 50 $\mu M$.

22. A process according to claim 21 wherein said average dimensional size is equal to or less than about 25 $\mu M$.

23. A process according to claim 22 wherein said average dimensional size is equal to or less than about 10 $\mu M$.

24. A method of preparing a printed circuit board from a copper clad substrate which comprises:
(a) covering at least one surface of the copper cladding with a coating of a polymerizable protective material;
(b) masking the protective material with a predetermined circuit design image;
(c) exposing the protective material through the masking image to a source of energy to polymerize the exposed protective material;
(d) removing the non-polymerized protective material not exposed to the source of energy to provide the desired exposed pattern on the surface of the copper cladding;
(e) contacting said surface with a reactive effective amount of one or more reactive gases forming one or more reaction products on the surface of said metal which are more friable than said metal;
(f) striking said reaction products with a plurality of abrasive particles at a velocity and for a time sufficient to erode away all or a portion of said reaction products from said surface; and
(g) removing the polymerized protective material to provide copper circuits on one or more surfaces of said board.

25. A method according to claim 24 for manufacturing an electrical circuit board having plated through holes for electrically interconnecting circuits on opposite surfaces of said board which further comprises
(a) forming apertures through said substrate at the locations of the desired plated through holes, and electroless copper plating the exposed surfaces of said apertures and opposite surfaces of said substrate prior to covering one or more surfaces of said substrate with said protective material; and
(b) electrolytic copper plating said electroless plated apertures and said circuit image after removing said portions of said protective material.

26. A method according to claim 24 for manufacturing an electrical circuit board having plated through holes for electrically interconnecting circuits on opposite surfaces of said board which further comprises forming apertures through said substrate at the locations of the desired plated through holes, electroless copper plating the exposed surfaces of said apertures and opposite surfaces of said substrate, and electrolytically copper plating said surfaces of said apertures and said surfaces of said substrate prior to covering said one or more surfaces of said substrate with said protective material.

27. A method according to claim 24 which comprises covering at least two surfaces of said copper cladding with a coating of a polymerizable protective material and electrically interconnecting said copper circuits with one or more plated through holes.

28. A method according to claim 24 wherein said protective material is a polymerized photoresist adhered to the surface of said copper cladding.

29. In an improved method of manufacturing printed circuit boards of the type which comprises the steps of:
(a) electrolessplating a metal plate onto at least one surface of a substrate composed of an insulating material;
(b) applying to a portion of said metal plating a protective material to provide the desired circuit pattern on said surfaces of the metal plating;
(c) electroplating the desired circuit pattern with a metal plating;
(d) removing said protective material from said metal plated substrate; and
(e) differentially etching said metal from a portion of metal cladding covered by said protective material to provide a board having the desired metal circuit pattern on at least one surface thereof; wherein said improvement comprises differentially etching said metal from said board by contacting said metal with a reactive effective amount of one or more reactive gases forming one or more reaction products on the surface of said metal, which products are more friable than said metal; and striking said reaction products with a plurality of abrasive particles at a velocity and for a time sufficient to erode away all or a portion of said reaction products from the surface of said metal.

30. A method of preparing a printed circuit board from a copper clad substrate which comprises:

(a) covering one or more surfaces of the copper clad substrate with a coating of a protective material;

(b) masking the protective material with a predetermined circuit design image;

(c) exposing the protective material to a source of energy to provide a resist layer portion susceptible to an etchant over a desired circuit image on one or more surfaces, and a resist layer portion resistant to said etchant over the remainder of said surfaces;

(d) removing those portions of the protective material which are susceptible to the etchant to provide the desired circuit image on said surfaces of the copper cladding;

(e) electroplating the desired circuit image with a metallic etch resist;

(f) removing the remaining portions of the photoresist from said board exposing a portion of the copper cladding; and (g) removing the exposed copper cladding from the board to provide a board having copper circuit covered by a metallic etch resist, said improvement comprising contacting said exposed copper cladding of step (f) with a reactive effective amount of one or more reactive gases forming one or more reaction products on the surface of said cladding, which products are more friable than copper; and striking said reaction products with a plurality of abrasive particles at a velocity and for a time sufficient to erode away all or a portion of said reaction products from the surface of said cladding.

31. A method according to claim 30 wherein the remaining portions of the photoresist after the metallic etch resist is electroplated are removed by the action of reactive gases and abrasive particles.

32. A method according to claim 30 which further comprises:

(a) electroless copper plating one or more surfaces of said copper clad substrate prior to covering said one or more surfaces of said substrate with said protective material; and (b) electrolytic copper plating said circuit image after removing said portions of said protective material which are susceptible to said etchant.

33. A method according to claim 30 for manufacturing an electrical circuit board having plated through holes for electrically interconnecting circuits on opposite surfaces of said board which further comprises (a) forming apertures through said substrate at the locations of the desired plated through holes, and electroless copper plating the exposed surfaces of said apertures and opposite surfaces of said substrate prior to covering one or more surfaces of said substrate with said protective material; and (b) electrolytic copper plating said electroless plated apertures and said circuit image after removing said portions of said protective material which are susceptible to said etchant.

34. A method according to claim 30 which further comprises electroless copper plating one or more surfaces of said substrate, and thereafter electrolytically copper plating said surfaces prior to covering said surfaces with said protective material.

35. A method according to claim 34 for manufacturing an electrical circuit board having plated through holes for electrically interconnecting circuits on opposite surfaces of said board which further comprises forming apertures through said substrate at the locations of the desired plated through holes, electroless copper plating the exposed surfaces of said apertures and opposite surfaces of said substrate, and electrolytically copper plating said surfaces of said apertures and said surfaces of said substrate prior to covering said one or more surfaces of said substrate with said protective material.

* * * * *